(12) United States Patent
Kitami

(10) Patent No.: US 7,864,094 B2
(45) Date of Patent: Jan. 4, 2011

(54) SOLID-STATE IMAGE SENSING DEVICE, IMAGING METHOD, AND IMAGING APPARATUS

(75) Inventor: Hirotaka Kitami, Kanagawa (JP)

(73) Assignee: Sony Corporation, Tokyo (JP)

( * ) Notice: Subject to any disclaimer, the term of this patent is extended or adjusted under 35 U.S.C. 154(b) by 9 days.

(21) Appl. No.: 12/458,043

(22) Filed: Jun. 30, 2009

(65) Prior Publication Data
US 2010/0033362 A1 Feb. 11, 2010

(30) Foreign Application Priority Data
Aug. 11, 2008 (JP) ............................. 2008-207442

(51) Int. Cl.
*H03M 1/56* (2006.01)
(52) U.S. Cl. ...................................... 341/169; 341/155
(58) Field of Classification Search ................. 341/155, 341/169
See application file for complete search history.

(56) References Cited

U.S. PATENT DOCUMENTS

| | | | |
|---|---|---|---|
| 5,877,715 A * | 3/1999 | Gowda et al. ................ | 341/122 |
| 5,920,274 A * | 7/1999 | Gowda et al. ................ | 341/155 |
| 6,914,631 B2 | 7/2005 | Udo et al. | |
| 6,963,373 B2 | 11/2005 | Imaizumi | |
| 6,965,407 B2 * | 11/2005 | Boemler et al. ............. | 348/302 |
| 7,230,558 B2 * | 6/2007 | Lim ........................... | 341/155 |
| 2005/0253942 A1 | 11/2005 | Muramatsu et al. | |

FOREIGN PATENT DOCUMENTS

| JP | 11-243339 A | 9/1999 |
|---|---|---|
| JP | 3710361 | 8/2005 |
| JP | 3734717 | 10/2005 |
| JP | 2005-328135 | 11/2005 |
| JP | 2006-352597 A | 12/2006 |

OTHER PUBLICATIONS

Japanese Office Action issued Jun. 15, 2010 for corresponding Japanese Application No. 2008-207442.

* cited by examiner

*Primary Examiner*—Khai M Nguyen
(74) *Attorney, Agent, or Firm*—Rader, Fishman & Grauer PLLC

(57) ABSTRACT

A solid-state image sensing device includes: a pixel unit that has plural pixels and outputs analog pixel signals; a ramp signal generator unit that generates a ramp signal having a predetermined initial voltage and a fixed gradient; and an analog-digital converter unit that compares the analog pixel signals output by the pixel unit to the ramp signal generated by the ramp signal generator unit and digitally converts the analog pixel signals based on a comparison time, wherein the analog-digital converter unit can perform operation in a digital addition mode of adding the analog pixel signals output from the plural pixels of the pixel unit among plural pixels and outputting the signals as digital pixel signals, and the ramp signal generator unit can set the initial voltage of the ramp signal to an arbitrary value after resetting a potential of the ramp signal in the digital addition mode.

7 Claims, 7 Drawing Sheets

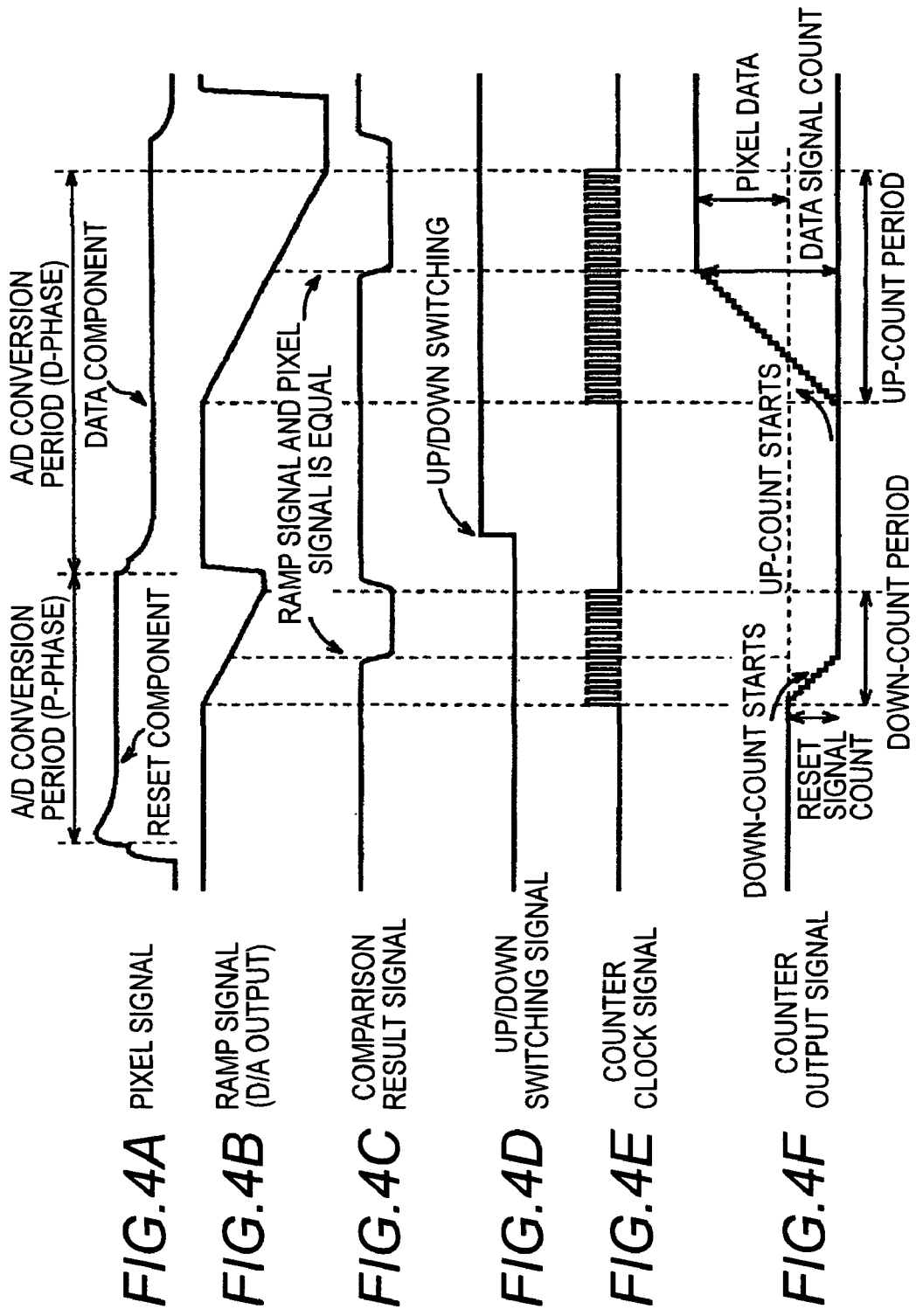

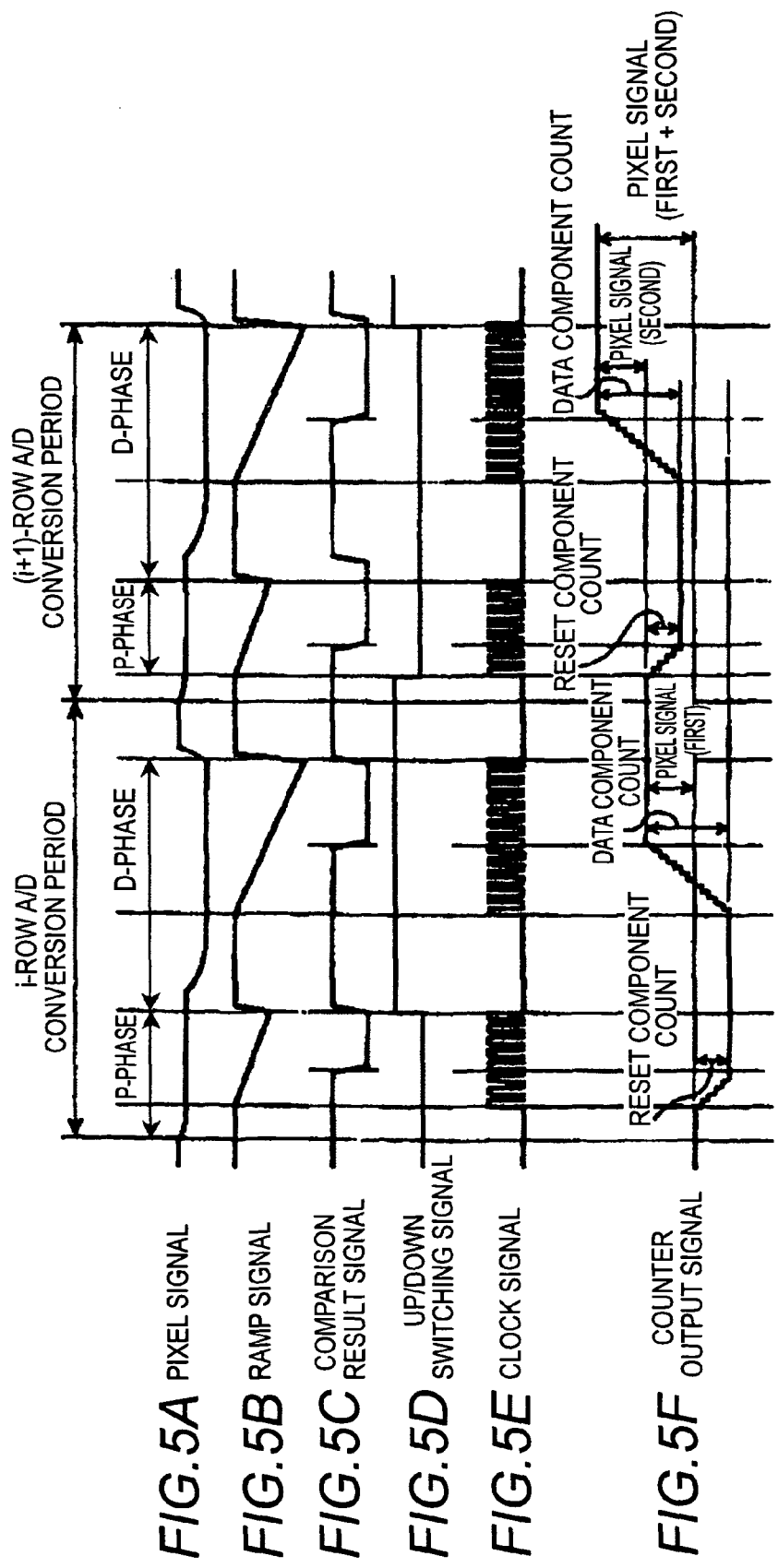

300

SOLID-STATE IMAGE SENSING DEVICE, IMAGING METHOD, AND IMAGING APPARATUS

BACKGROUND OF THE INVENTION

1. Field of the Invention

The present invention relates to a solid-state image sensing device such as a CMOS image sensor that digitalizes and outputs analog pixel signals output from pixels, and an imaging method and an imaging apparatus.

2. Background Art

In the related art, in a CMOS (Complementary Metal-Oxide Semiconductor) sensor as a solid-state image sensing device, image signal processing is performed using a CDS (Correlated Double Sampling) circuit.

For example, Japanese Patents Nos. 3734717 and 3710361 disclose a CMOS sensor that removes noise contained in image signals by passing light reception signals from photodiodes within pixels through analog CDS circuits provided with respect to each pixel column and performs A/D (Analog/Digital) conversion thereon.

However, when the CDS circuits are used in this manner, there is a problem that noise in a streaky fixed pattern occurs due to variations of CDS circuits with respect to each pixel column. Further, there are problems that capacitative elements for holding signal values after CDS processing are necessary and the circuit areas are increased, and analog signals are horizontally scanned at a high speed with a shift register and easily affected by switching noise.

Accordingly, for example, JP-A-2005-328135 proposes that these problems are solved by a column parallel A/D conversion system (hereinafter, referred to as a column AD system).

In the column AD system, A/D converters are provided with respect to each pixel column, and analog signals of the respective pixels are read out together with respect to selected columns into the respective vertical signal lines, and A/D conversion is directly performed thereon. Accordingly, the problems occurring when the above described CDS circuits are used are solved and high-accuracy noise removal can be executed.

Further, in the column AD system, parallel processing with respect to each horizontal row of an image is performed, and it is not necessary to drive horizontal scan at a high-speed frequency. Therefore, there are advantages that A/D conversion can be performed at a vertical low-speed frequency, and the noise component generated in a high-frequency band and the signal component can be easily separated.

In the CMOS sensor employing the column AD system, the pixel signals supplied from the pixels to the A/D converters contain reset components according to a predetermined reference potential and data components according to amounts of received light of the pixels.

Further, a ramp signal (ramp voltage) as a signal that is referred to at A/D conversion of the pixel signals is supplied to the A/D converters.

The ramp signal has a waveform in which the voltage drops with a fixed gradient from a predetermined initial voltage in a period according to the reset components of the pixel signals, and the voltage drops with a fixed gradient from a predetermined initial voltage in a period according to the data components of the pixel signals.

SUMMARY OF THE INVENTION

However, in such a CMOS sensor of column AD system, there has been a disadvantage that current may flow in a resistor used in a ramp waveform generator circuit for generating a ramp waveform or the like, and thermal noise and horizontal noise may occur.

Thus, it is desirable to provide a solid-state image sensing device, an imaging method, and an imaging apparatus with which noise generation when a ramp waveform is generated can be suppressed.

A solid-state image sensing device according to a first embodiment of the present invention has a pixel unit that has plural pixels and outputs analog pixel signals, a ramp signal generator unit that generates a ramp signal having a predetermined initial voltage and a fixed gradient, and an analog-digital converter unit that compares the analog pixel signals output by the pixel unit to the ramp signal generated by the ramp signal generator unit and digitally converts the analog pixel signals based on a comparison time, wherein the analog-digital converter unit can perform operation in a digital addition mode of adding the analog pixel signals output from the plural pixels of the pixel unit among plural pixels and outputting the signals as digital pixel signals, and the ramp signal generator unit can set the initial voltage of the ramp signal to an arbitrary value after resetting a potential of the ramp signal in the digital addition mode.

According to the solid-state image sensing device according to the first embodiment, in the case where imaging is performed in the digital addition mode, the ramp signal generator unit can set an output start voltage of the ramp signal after resetting when starting output of the ramp signal to the arbitrary value.

An imaging method of solid-state image sensing device according to a second embodiment of the present invention, when a solid-state image sensing device having a pixel unit having plural pixels, a ramp signal generator unit, and an analog-digital converter unit that compares analog pixel signals output by the pixel unit to a ramp signal generated by the ramp signal generator unit and digitally converts the analog pixel signals by counting a comparison time performs imaging processing in a digital addition mode of adding the analog pixel signals output from the plural pixels of the pixel unit among plural pixels and outputting the signals as digital pixel signals, the method including the steps of the first step of the pixel unit outputting analog pixel signals, the second step of the ramp signal generator unit generating a ramp signal having a predetermined initial voltage and a fixed gradient, and the third step of comparing the analog pixel signals to the ramp signal and digitally converting the analog pixel signals by counting a comparison time, wherein the second step includes the fourth step of the ramp signal generator unit setting the predetermined initial voltage to an arbitrary value and generating the ramp signal.

An imaging apparatus of according to a third embodiment of the present invention includes a solid-state image sensing device having plural pixels, and an optical system that focuses light from a subject onto the pixels of the solid-state image sensing device, wherein the solid-state image sensing device includes a pixel unit that has plural pixels and outputs analog pixel signals, a ramp signal generator unit that generates a ramp signal having a predetermined initial voltage and a fixed gradient, and an analog-digital converter unit that compares the analog pixel signals output by the pixel unit to the ramp signal generated by the ramp signal generator unit and digitally converts the analog pixel signals based on a comparison time, the analog-digital converter unit is adapted to be able to perform operation in a digital addition mode of adding the analog pixel signals output from the plural pixels of the pixel unit among plural pixels and outputting the signals as digital pixel signals, and the ramp signal generator unit can set the initial voltage of the ramp signal to an arbitrary value after resetting a potential of the ramp signal in the digital addition mode.

According to the embodiments of the invention, noise generation when a ramp waveform is generated can be suppressed.

BRIEF DESCRIPTION OF THE DRAWINGS

FIGS. 4A to 4F illustrate a timing chart for explanation of an operation example of the CMOS image sensor at a normal mode.

FIGS. 5A to 5F illustrate a timing chart showing an operation example at imaging of the CMOS image sensor in a digital addition mode.

DESCRIPTION OF PREFERRED EMBODIMENTS

Hereinafter, a CMOS image sensor 100 according to an embodiment of the invention will be explained.

Figure 1:
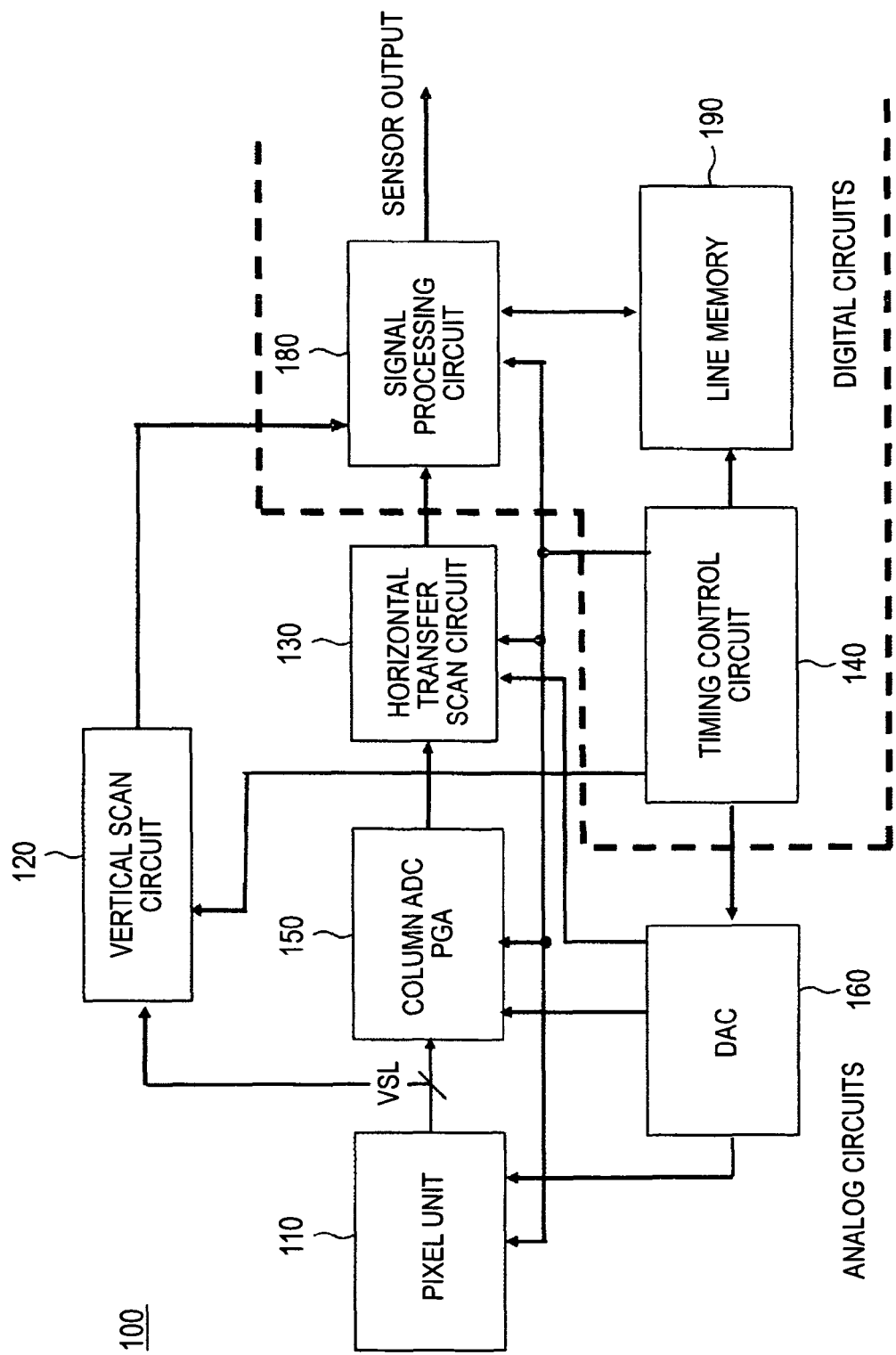
FIG. 1 is a block diagram showing a configuration example of a CMOS image sensor according to an embodiment of the invention.

FIG. 1 is a block diagram showing a configuration example of the CMOS image sensor 100 according to the embodiment of the invention.

The CMOS image sensor 100 shown in FIG. 1 is a (column AD system) solid-state image sensing device including column parallel A/D convertors.

The CMOS image sensor 100 shown in FIG. 1 has a pixel unit 110 as an imaging unit, a vertical scan circuit 120, a horizontal transfer scan circuit 130, and a timing control circuit 140.

Further, the CMOS image sensor 100 has an ADC group 150 as a pixel signal readout circuit, a DAC (digital-analog convertor device) 160, a signal processing circuit 180, and a line memory 190.

From these component elements, the pixel unit 110, the vertical scan circuit 120, the horizontal transfer scan circuit 130, the ADC group 150, and the DAC 160 are formed by analog circuits.

Further, the timing control circuit 140, the signal processing circuit 180, and the line memory 190 are formed by digital circuits.

The ADC group 150 of the embodiment corresponds to an analog-digital convertor unit of an embodiment of the present invention.

Further, the DAC 160 of the embodiment corresponds to a ramp signal generator unit of an embodiment of the present invention.

The pixel unit 110 is formed by arranging pixels including photodiodes and amplifiers within pixel in a matrix as shown in FIG. 1, for example.

The pixel unit 110 performs photoelectric conversion on videos and screen images with respect to each pixel row by photon accumulation and ejection using a line shutter, and sequentially outputs analog output signals (hereinafter, referred to as pixel signals) VSL generated by the respective pixels.

Further, in order to sequentially read out the pixel signals output from the pixel unit 110, the timing control circuit 140 that generates internal clocks, the vertical scan circuit 120 that controls row address and row scan, and the horizontal transfer scan circuit 130 that controls column address and column scan are provided.

The timing control circuit 140 generates timing signals necessary for signal processing of the pixel unit 110, the vertical scan circuit 120, the horizontal transfer scan circuit 130, the ADC group (column ADC circuits) 150, the DAC 160, the signal processing circuit 180, and the line memory 190.

The ADC group 150 has a function of performing APGA-compliant integer AD (Analog-Digital) conversion on the pixel signals output from the pixel unit 110 using the ramp signal RAMP from the DAC 160, which will be described later, in the ADC blocks (the respective column parts). The ADC group 150 further has a function of digital CDS (Correlated Double Sampling) and outputs several bits of digital signals.

Figure 2:
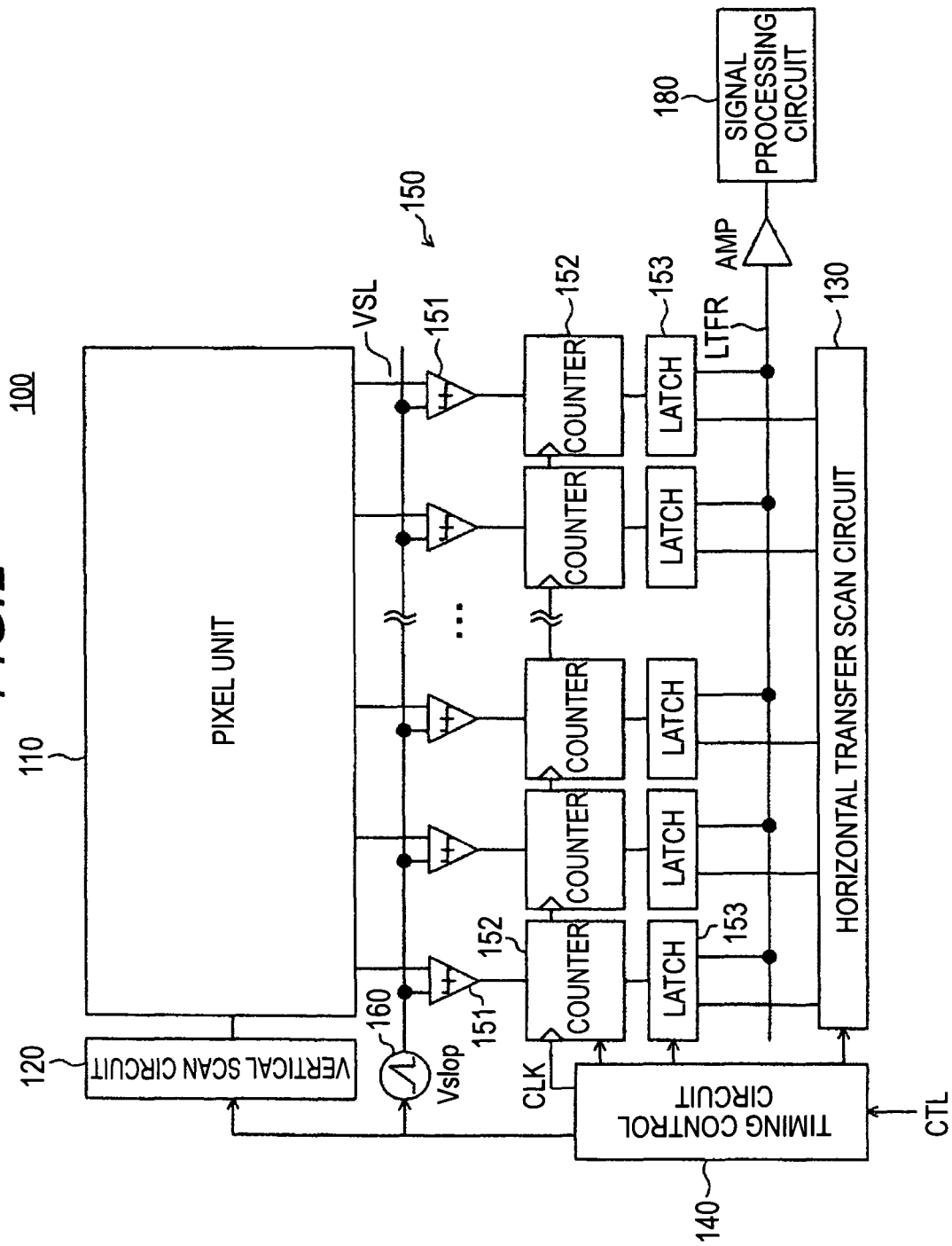
FIG. 2 shows a specific example of a configuration of an ADC group in the CMOS image sensor of the embodiment.

A specific example of a configuration of the ADC group 150 in the CMOS image sensor 100 of the embodiment is shown in FIG. 2.

FIG. 2 shows a relationship between the specific configuration of the ADC group 150 and other configurations.

As shown in FIG. 2, the ADC group 150 has comparators 151, counters 152, and latches 153.

The comparators 151 compare the voltage Vslop of the ramp signal RAMP of the ramp waveform with the reference voltage changed in steps generated by the DAC 160 to the potentials VSL of the pixel signals obtained from the pixels with respect to each row line via the vertical signal lines from the pixel unit 110.

The counters 152 count the comparison times of the comparators 151.

The latches 153 hold count results of the counters 152.

The analog pixel signals (potentials VSL) read out into the vertical signal lines are compared to the voltage Vslop (ramp signal RAMP as a slope waveform that changes to a line shape having a certain gradient) of the ramp signal RAMP by the comparators 151 provided with respect to each column.

Under the control using the control signals provided from the timing control circuit 140, the counters 152 measure comparison periods from the start of the comparison operation to the end of the comparison operation in the comparators 151 in synchronization with the clocks also supplied from the timing control circuit 140.

The counters 152 can perform either of down-count or up-count according to the control signals provided from the timing control circuit 140.

When the comparators 151 operate, the counters 152 provided with respect to each column simultaneously operate, and the voltage Vslop of a certain ramp signal RAMP in the ramp waveform and the counter value changes while holding one-to-one correspondence between them and the potentials (analog signals) VSL of the vertical signal lines into digital signals.

When the voltage VSL of the analog pixel signal and the voltage Vslop of the ramp signal RAMP are equal, the output of the comparator 151 inverts, the input clock of the counter 152 is stopped, or the clock input of which has been stopped is input to the counter 152 and the AD conversion is completed.

The operation period of the CMOS image sensor 100 in the above processing is referred to as an AD conversion period.

After the AD conversion period is ended, in the CMOS image sensor 100, the data held in the latches 153 is transferred into the horizontal transfer line LTRF by the horizontal transfer scan circuit 130, input to the signal processing circuit 180, and a two-dimensional image is generated by predetermined signal processing.

In the horizontal transfer scan circuit 130, several channels are simultaneously transferred in parallel for securing the transfer speed.

In the timing control circuit 140, timings necessary for signal processing in the respective blocks of the pixel unit 110, the ADC group 150, etc. are generated.

In the signal processing circuit 180, correction of longitudinal line defects and point defects, signal clamping and digital signal processing such as parallel-serial conversion, compression, encoding, addition, averaging, intermittent operation, etc. are performed on the signals stored within the line memory 190.

The digital signals sent with respect to each pixel row are stored in the line memory 190.

Next, the DAC 160 will be explained in detail.

Figure 3B:
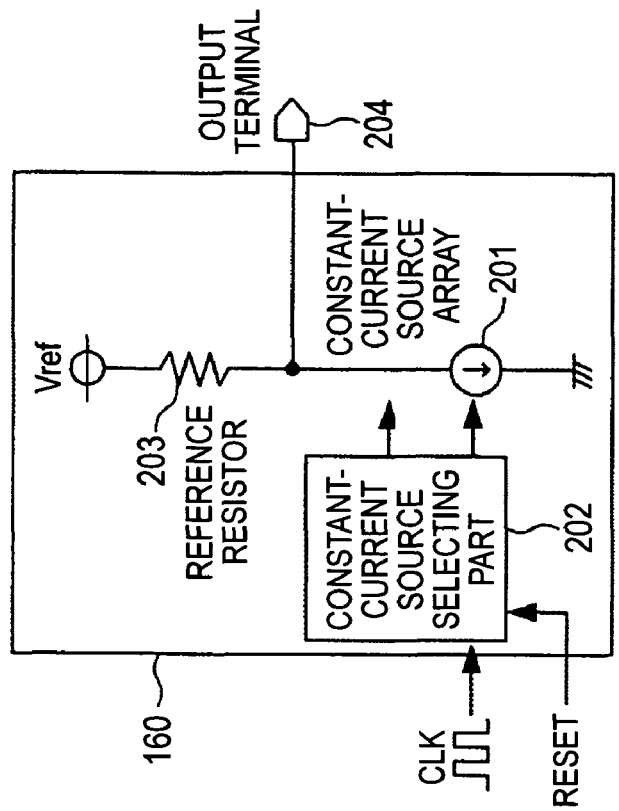
FIGS. 3A and 3B are block diagrams showing specific examples of a DAC that generates a ramp signal to be supplied to comparators of the CMOS image sensor.
Figure 3A:
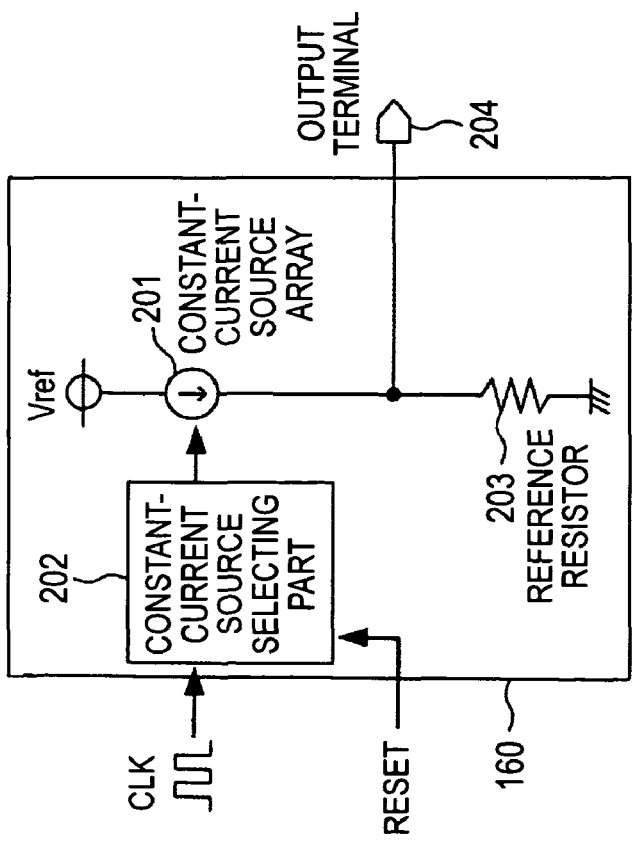

FIGS. 3A and 3B are block diagrams showing specific examples of the DAC 160 that generates a ramp signal to be supplied to the comparators 151 of the CMOS image sensor 100.

FIG. 3A shows an example of a configuration of the DAC 160.

As shown in FIG. 3A, the DAC 160 has a constant-current source array 201, a constant-current source selecting part 202, a reference resistor 203, and an output terminal 204.

The constant-current source selecting part 202 of the embodiment corresponds to the constant-current source of another embodiment of the present invention.

The constant-current source array 201 includes a gain changing constant-current source (not shown) and n ramp waveform generating constant-current sources (n is a positive integer number).

The gain changing constant-current source and the n ramp waveform generating constant-current sources form a current mirror (CM).

When the gain changing constant-current source changes the gain of the image imaged by the CMOS sensor, a control signal is supplied from the timing control circuit 140, and the current value of the gain changing constant-current source is changed according to the control signal and the gradient of the ramp signal is changed.

The n ramp waveform generating constant-current sources are selected by the constant-current source selecting part 202 and outputs current for generating the gradient of the ramp signal.

The constant-current source selecting part 202 counts the clocks from the timing control circuit 140 and sequentially selects a current source to flow current of the ramp waveform generating constant-current sources based on the count value.

The output terminal 204 is connected to the reference voltage Vref via the constant-current source array 201, and a ramp signal at the voltage according to the change of current output from the constant-current source array 201 is generated from the reference voltage Vref and output from the output terminal 204.

In the DAC 160 having the configuration, the constant-current source selecting part 202 selects which constant-current source of the constant-current source array 201 to flow current based on the count value of the clock signals. If the current flowing in the constant-current source flows in the reference resistor, the voltage generated in the reference resistor becomes the ramp signal.

The configuration of the DAC 160 shown in FIG. 3A is an example of the configuration of the DAC that generates the ramp signal. Generally, as a DAC used in the CMOS image sensor, not only the configuration shown in FIG. 3A but also a configuration shown in FIG. 3B may be used, for example.

In the DAC shown in FIG. 3B, the reference resistor is connected to the reference voltage Vref, and the DAC is hereinafter referred to as "reference power supply type DAC". On the other hand, in the above described DAC 160 shown in FIG. 3A, the reference resistor is grounded, and the DAC is hereinafter referred to as "ground reference type DAC".

Generally, as a DAC used in the CMOS sensor for supplying the ramp signal, the above described ground reference type ramp signal generator circuit shown in FIG. 3A is advantageous in view of resistance to noise. Accordingly, an example in which a ground reference type DAC is used as the DAC 160 will be explained as below.

The CMOS image sensor 100 of the embodiment employing the column AD system is formed to switch imaging modes according to imaging purposes. The modes include a normal imaging mode and a digital addition mode of performing high-speed imaging while thinning imaging information, for example.

The digital addition mode is a mode of performing digital addition processing of A/D converting analog pixel signals for plural pixels output by the pixel unit 110 at imaging and adding digital pixel signals.

The digital addition processing is processing of adding plural pixel signals of the same color filters adjacent in the respective pixels in digital signals.

By the digital addition processing, in the CMOS image sensor 100 of the embodiment, the imaging sensitivity per pixel can be substantially increased by the number of additions, and imaging with good exposure can be performed even in a short exposure time or high shutter speed.

As below, operation examples of the CMOS image sensor 100 of the embodiment will be described.

First, an operation example at imaging in the normal mode will be explained.

FIGS. 4A to 4F illustrate a timing chart for explanation of the operation example of the CMOS image sensor 100 in the normal mode.

FIG. 4A shows a pixel signal output from each pixel of the pixel unit 110.

FIG. 4B shows a ramp signal output by the DAC 160.

FIG. 4C shows a comparison result signal output by the comparator 151.

FIG. 4D shows a signal switching the count-up and the count-down of the counter 152 supplied from the timing control circuit 140 to the counter 152.

FIG. 4E shows a clock signal supplied from the timing control circuit 140 to the counter 152.

FIG. 4F shows a counter output signal output by the counter 152.

As shown in FIG. 4A, each pixel of the pixel unit 110 performs a reset operation and an operation of photoelectrically converting and outputting incident light according to the control signal supplied from the vertical scan circuit 120.

Each pixel outputs a pixel signal (reset component) according to a predetermined reference potential in a reset signal A/D conversion period (pre-charge phase: P-phase).

Further, each pixel outputs a pixel signal (data component) according to charge corresponding to received light of the photodetector of the pixel in a D-phase (data phase: D-phase).

As shown in FIG. 4B, the DAC 160 outputs the ramp signal in which the voltage drops from a predetermined initial voltage at a fixed gradient. In the ramp signal, the D-phase period is longer than the P-phase period.

The DAC 160 is reset when the output of the ramp signal is started and the output of the ramp signal at the voltage having a predetermined initial value (e.g., zero) is started.

As shown in FIG. 4C, the comparator 151 compares the voltage VSL of the pixel signal and the voltage Vslop of the ramp signal.

If the pixel signal is equal to or more than the ramp signal, a high-level comparison result signal is output, and, if the pixel signal is less than the ramp signal, a low-level comparison result signal is output.

That is, if the voltage of the ramp signal drops at the fixed gradient, when the ramp signal and the pixel signal are equal, the comparator 151 outputs a comparison result signal in transition from the high-level to the low-level.

As shown in FIG. 4D, the signal switching count-up and count-down of the counter 152 is supplied from the timing control circuit 140 to the ADC group 150.

The signal switching count-up and count-down of the counter 152 is at the low-level when the voltage of the ramp signal drops at the fixed gradient in the P-phase and at the high-level when the voltage of the ramp signal drops at the fixed gradient.

The timing control circuit 140 simultaneously supplies the control signal for switching count-up and count-down of the counter shown in FIG. 4D and the clock signal at a predetermined frequency shown in FIG. 4E, e.g., a high-speed counter clock signal at 500 MHz to the counter 152.

As shown in FIG. 4F, the counter 152 counts the counter clock signal and outputs a digital pixel signal.

That is, the counter 152 is in the count-down mode if the signal switching count-up and count-down of the counter 152 is the low-level, and starts down-count at the time when the voltage of the ramp signal starts to drop in the P-phase.

Then, the count value (reset component count) obtained by counting until the time when the comparison result signal makes transition from the high-level to the low-level is held. Subsequently, the signal switching count-up and count-down of the counter 152 makes transition from the low-level to the high-level, and the counter 152 turns into the count-up mode.

Then, the up-count is started when the voltage of the ramp signal starts to drop in the D-phase, and the count value (data component count) obtained by counting until the time when the comparison result signal makes transition from the high-level to the low-level is taken.

Finally, the analog pixel signal is digitalized by subtracting the reset component count from the count component count and output as a digital pixel signal.

Next, an operation example of the CMOS image sensor 100 in the digital addition mode will be explained.

As described above, in the digital addition mode, digital addition processing of A/D converting analog pixel signals for plural pixels output by the pixel unit 110 at imaging and adding digital pixel signals is performed.

The digital addition processing is processing of adding plural pixel signals of the same color filters adjacent in the respective pixels in digital signals.

Here, as the operation example of the CMOS image sensor 100 in the digital addition mode, for example, the case where the pixel unit 110 is formed by m columns×n row pixels and plural pixel signals forming a specific i-column are read (m, n are positive integer numbers and i is an integer number equal to or less than n) will be explained.

FIGS. 5A to 5F illustrate a timing chart showing the operation example at imaging of the CMOS image sensor 100 in the digital addition mode.

As shown in FIGS. 5A to 5F, in the digital addition mode, readout of pixel signals from the i-row (the first readout) and readout of pixel signals from the (i+1)-row (the second readout) are performed in one set. Then, digital pixel signals calculated based on the count values obtained by the first and second readouts are added after the second readout, and the pixel signals for two readouts are output.

Thereby, the counter 152 can lead the pixel signals for two rows of the pixels of the i-row and the pixels of the (i+1)-row at a time.

By repeating the same operation, an image in which pixel information is thinned to half in the vertical direction (in the column direction in the pixel unit 110 having the matrix form) can be obtained. Consequently, the frame rate can be made faster to twice the frame rate in the normal mode of reading all pixel information.

In the digital addition mode, the AD conversion period is limited, and the fluctuation range of the ramp waveform is smaller than that in the normal mode that has been described in connection to FIGS. 4A to 4F.

Figure 6A:
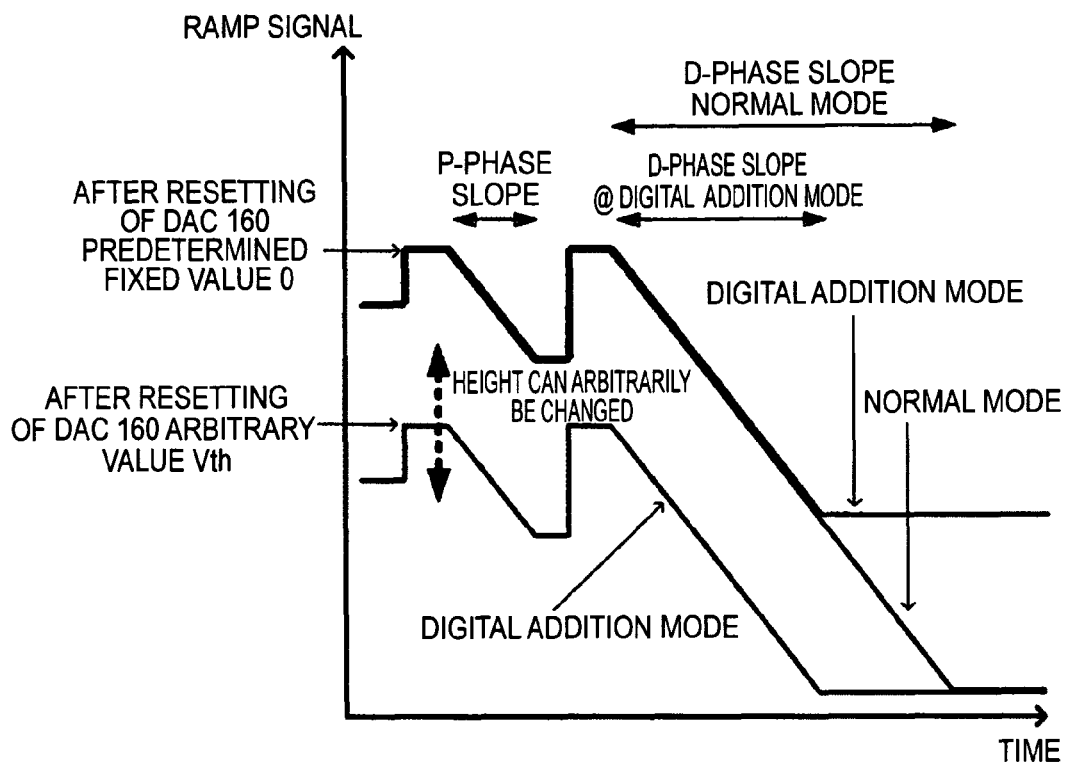
FIGS. 6A and 6B show ramp waveforms in the normal mode and the digital addition mode.
Figure 6B:
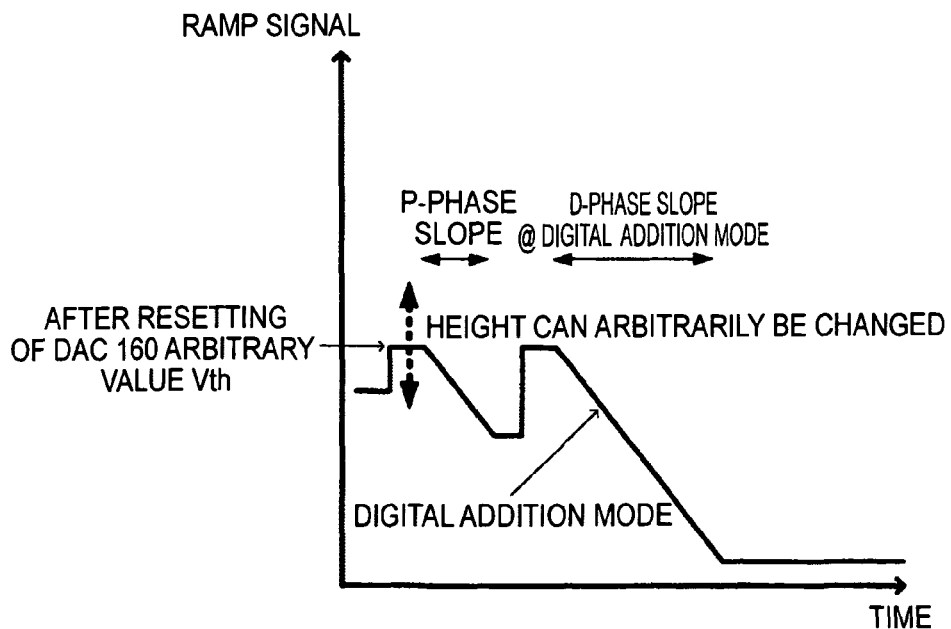

FIGS. 6A and 6B show ramp waveforms in the normal mode and the digital addition mode.

The ramp waveforms in the normal mode and the digital addition mode shown in FIG. 6A are obtained when a predetermined fixed value (e.g., zero) is used as an initial value after resetting.

As shown in FIG. 6A, since the AD conversion period is limited in the digital addition mode, the fluctuation range of the ramp waveform is smaller than that in the normal mode that has been described in connection to FIGS. 4A to 4F. The ramp waveforms in the digital addition mode shown in FIGS. 6A and 6B are those obtained at the first readout, however, the readout is repeated at plural times in the digital addition mode and the fluctuation range of the ramp waveforms at the second readout is also smaller than that in the normal mode as is the case of FIGS. 6A and 6B.

As shown in FIGS. 6A and 6B, in the normal mode, the voltage of the ramp signal takes the lowest value Vl after the D-phase slope. However, in the digital addition mode, the AD conversion period (D-phase slope time) is shorter than that in the normal mode, and the ramp signal is stopped in the middle at the voltage Vdig higher than Vl, for example.

In the digital addition mode, after the D-phase slope is ended at the first readout, the voltage of the ramp signal remains fixed to Vdig until the second readout is started. While the ramp signal is output, current flows in the DAC 160 that outputs the ramp signal. Thus, current continues to flow in the reference resistor 203 after the D-phase slope is ended at the first readout until the second readout is started, and the power consumption and thermal noise are increased.

Accordingly, in the CMOS image sensor 100 of the embodiment, as shown in FIG. 6B, in the digital addition mode, in the DAC 160, the output start voltage of the ramp signal after resetting can be set to an arbitrary value (e.g., Vth).

The ramp signal is reset in this manner that the reset signal is input from the timing control circuit 140 to the constant-current source selecting part 202 and the count value of clocks is initialized.

That is, the amount of current of the constant-current source array 201 can be set to an arbitrary value after resetting, and thereby, the voltage value generated in the reference resistor 203 becomes the arbitrary value Vth.

As shown in FIG. 6B, in the CMOS image sensor 100 of the embodiment, in the digital addition mode, the voltage initial value of the ramp signal after resetting of the DAC 160 is set to the value Vth lower than the predetermined fixed value of zero in advance. Thereby, the voltage of the ramp signal after the D-phase slope can be suppressed to the lower value than the predetermined fixed value of zero shown in FIG. 6A. Then, the amount of current flowing in the DAC 160 is reduced and the power consumption and thermal noise in the DAC 160 can be prevented.

In the above explanation, the predetermined fixed value is set to zero, however, the present invention is not limited to that The predetermined fixed value is an initial value of the ramp signal after resetting of the DAC 160 in the normal mode, for example, and the arbitrary value Vth may be different from that value.

As described above, the CMOS image sensor 100 of the embodiment has two operation modes of the digital addition mode of A/D converting analog pixel signals for plural pixels output by the pixel unit 110 at imaging and adding digital pixel signals and the normal mode.

Further, in the case where imaging is performed in the digital addition mode, the DAC 160 can set the output start voltage of the ramp signal after resetting when starting output of the ramp signal to the arbitrary value Vth.

In the CMOS image sensor 100 of the embodiment, according to the above described configuration, as shown in FIG. 6B, the voltage of the ramp signal after the D-phase slope can be suppressed to the lower value than the predetermined fixed value of zero shown in FIG. 6A.

Accordingly, the amount of current flowing in the DAC 160 is reduced and the power consumption and thermal noise in the DAC 160 can be prevented. Especially, the power consumption at imaging in the digital addition mode can be drastically reduced compared to that at imaging in the normal mode.

The above described CMOS image sensor 100 of the embodiment can be applied as a solid-state image sensing device to an imaging apparatus such as a digital camera.

As below, an application example will be explained.

Figure 7:
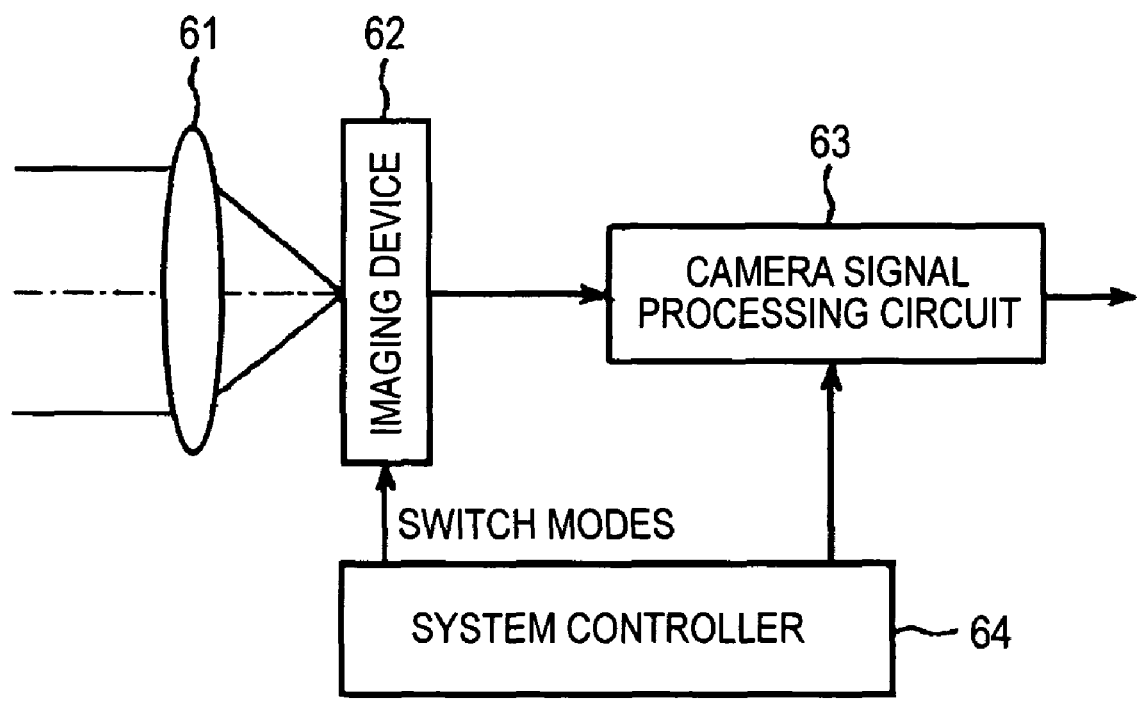
FIG. 7 is a block diagram showing an example of a configuration of an imaging apparatus.

FIG. 7 is a block diagram showing an example of a configuration of an imaging apparatus 300.

As shown in FIG. 7, the imaging apparatus 300 includes an optical system 61 containing lenses (corresponding to an optical system of an embodiment of the present invention), an imaging device 62, a camera signal processing circuit 63, a system controller 64, etc.

The optical system 61 focuses image light from a subject onto an imaging surface of the imaging device 62 with a lens or the like. The imaging device 62 outputs image signals obtained by converting the image light focused on the imaging surface by the optical system 61 into electric signals in units of pixels. As the imaging device 62, the CMOS image sensor 100 with column parallel ADC according to the above described embodiment is used.

The camera signal processing circuit 63 performs various signal processing on the image signals output from the imaging device 62. The system controller 64 performs control on the imaging device 62 and the camera signal processing circuit 63.

Especially, the column parallel ADC of the imaging device 62 has a normal frame rate mode in the progressive scan system of reading out information on all pixels. Further, the column parallel ADC of the imaging device 62 has a high-speed frame mode in which the exposure time of pixels is set to 1/N and the frame rate is increased to N times the frame rate in the normal frame rate mode. In this case, in the column parallel ADC of the imaging device 62, if the AD conversion operations corresponding to the respective operation modes can be performed, switching between the operation modes can be controlled according to an external instruction.

The present invention is not limited to the above described embodiments.

That is, in the practice of the present invention, various changes and alterations can be made to the component elements in the above described embodiments within the technical scope of the present invention and the equivalent scope thereof.

The present application contains subject matter related to that disclosed in Japanese Priority Patent Application JP 2008-207442 filed in the Japan Patent Office on Aug. 11, 2008, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image sensing device comprising:
   a pixel unit that has plural pixels and outputs analog pixel signals;
   a ramp signal generator unit that generates a ramp signal having a predetermined initial voltage and a fixed gradient; and
   an analog-digital converter unit that compares the analog pixel signals output by the pixel unit to the ramp signal generated by the ramp signal generator unit and digitally converts the analog pixel signals based on a comparison time,
   wherein the analog-digital converter unit can perform operation in a digital addition mode of adding the analog pixel signals output from the plural pixels of the pixel unit among plural pixels and outputting the signals as digital pixel signals, and
   the ramp signal generator unit can set the initial voltage of the ramp signal to an arbitrary value after resetting a potential of the ramp signal in the digital addition mode.

2. The solid-state image sensing device according to claim 1, wherein the analog-digital converter unit includes:
   a comparator that compares the analog pixel signal output by the pixel unit and the ramp signal generated by the ramp signal generator unit; and
   a counter that counts a time from start to end of a comparison by the comparator,
   wherein the counter adds the pixel signals among the plural pixels in the digital addition mode.

3. The solid-state image sensing device according to claim 2, further comprising a timing control unit for generating clock signals,
   wherein the ramp signal generator unit includes:
   plural constant-current sources that output current for generating the ramp signal;

a constant-current source selecting part that counts clock signals of the timing control unit and determines which constant-current source of the plural constant-current sources to select to output current;

a power source part connected to one end of the constant-current source and an output terminal connected to the other end of the constant-current source and outputting the ramp signal; and a reference resistor with one end connected to a connecting part of the constant-current source and the output terminal and the other end grounded, wherein the constant-current source selecting part performs resetting by initializing the count value before generation of the ramp signal is started.

4. The solid-state image sensing device according to claim 3, wherein the ramp signal generator unit sets the initial voltage of the ramp signal after the resetting to an arbitrary value different from a predetermined fixed value as the initial voltage after resetting in a normal mode of converting the analog pixel signals output from the plural pixels of the pixel unit without adding the signals into digital pixel signals and outputting the signals.

5. The solid-state image sensing device according to claim 4, wherein the pixel unit has plural pixels arranged in a matrix, and the digital-analog convertor unit digitally converts the analog pixel signals of the plural pixels with respect to each row of plural pixels forming the matrix.

6. An imaging method for solid-state image sensing device when a solid-state image sensing device having a pixel unit having plural pixels, a ramp signal generator unit, and an analog-digital converter unit that compares analog pixel signals output by the pixel unit to a ramp signal generated by the ramp signal generator unit and digitally converts the analog pixel signals by counting a comparison time performs imaging processing in a digital addition mode of adding the analog pixel signals output from the plural pixels of the pixel unit among plural pixels and outputting the signals as digital pixel signals, the method comprising the steps of:

the first step of the pixel unit outputting analog pixel signals;

the second step of the ramp signal generator unit generating a ramp signal having a predetermined initial voltage and a fixed gradient; and the third step of comparing the analog pixel signals to the ramp signal and digitally converting the analog pixel signals by counting a comparison time, wherein the second step includes the fourth step of the ramp signal generator unit setting the predetermined initial voltage to an arbitrary value and generating the ramp signal.

7. An imaging apparatus comprising:

a solid-state image sensing device having plural pixels; and an optical system that focuses light from a subject onto the pixels of the solid-state image sensing device, wherein the solid-state image sensing device includes a pixel unit that has plural pixels and outputs analog pixel signals, a ramp signal generator unit that generates a ramp signal having a predetermined initial voltage and a fixed gradient, and an analog-digital converter unit that compares the analog pixel signals output by the pixel unit to the ramp signal generated by the ramp signal generator unit and digitally converts the analog pixel signals based on a comparison time, the analog-digital converter unit is adapted to be able to perform operation in a digital addition mode of adding the analog pixel signals output from the plural pixels of the pixel unit among plural pixels and outputting the signals as digital pixel signals, and the ramp signal generator unit can set the initial voltage of the ramp signal to an arbitrary value after resetting a potential of the ramp signal in the digital addition mode.

* * * * *